(12) United States Patent
Kakishima

(10) Patent No.: US 8,757,795 B2
(45) Date of Patent: Jun. 24, 2014

(54) COMPONENT SUPPORTING DEVICE AND INK-JET DEVICE

(71) Applicant: Toshiba Tec Kabushiki Kaisha, Tokyo (JP)

(72) Inventor: Shoichi Kakishima, Shizuoka-ken (JP)

(73) Assignee: Toshiba Tec Kabushiki Kaisha, Tokyo (JP)

(*) Notice: Subject to any disclaimer, the term of this patent is extended or adjusted under 35 U.S.C. 154(b) by 0 days.

(21) Appl. No.: 13/762,442

(22) Filed: Feb. 8, 2013

(65) Prior Publication Data
US 2013/0250024 A1 Sep. 26, 2013

(30) Foreign Application Priority Data
Mar. 21, 2012 (JP) ................................. 2012-064283

(51) Int. Cl.
B41J 29/13 (2006.01)
(52) U.S. Cl.
USPC ............... 347/108; 347/86; 347/87; 361/752; 361/740
(58) Field of Classification Search
USPC ............... 347/108, 109, 86, 87; 361/752, 740
See application file for complete search history.

(56) References Cited

U.S. PATENT DOCUMENTS

| 5,819,627 | A  | * | 10/1998 | Hayao | ............................. | 83/631 |
| 6,859,370 | B1 | * | 2/2005  | Hsu et al. | ....................... | 361/752 |
| 8,235,501 | B2 | * | 8/2012  | Oguchi | ........................... | 347/47 |
| 2012/0147096 | A1 |   | 6/2012  | Yamamoto | | |

FOREIGN PATENT DOCUMENTS

JP 11-274765 10/1999

* cited by examiner

*Primary Examiner* — Henok Legesse
(74) *Attorney, Agent, or Firm* — Amin, Turocy & Watson, LLP

(57) ABSTRACT

According to one embodiment, a component supporting device includes a cover having a through-hole, a support covered with the cover, a component arranged between the cover and the support, and a fixing tool which is inserted into the through-hole of the cover from an outside of the cover and sandwiches the component between the support and the fixing tool. The fixing tool includes an elastically deformable main body having an apical surface to butt to the component, a hook provided on the main body to engage with an edge of the through-hole inside the cover, and an operating portion provided on the main body to protrude from the through-hole outside the cover which is configured to release the engagement of the hook with the edge of the through-hole through elastic deformation of the main body.

15 Claims, 5 Drawing Sheets

COMPONENT SUPPORTING DEVICE AND INK-JET DEVICE

CROSS-REFERENCE TO RELATED APPLICATION

This application is based upon and claims the benefit of priority from the prior Japanese Patent Application No. 2012-064283, filed on Mar. 21, 2012, the entire contents of which are incorporated herein by reference.

FIELD

Exemplary embodiments described herein relate to a component supporting device which utilizes a snap-fit system and an ink-jet device.

BACKGROUND

An ink-jet device is provided with a print circuit board to control an ink-jet head. The print circuit board along with a holder which is provided on the ink-jet head are covered with a cover. In addition, the print circuit board is held between the cover and the holder using a plurality of screws.

The screws are screwed into the cover, and apexes of the screws are butted to the print circuit board inside the cover. Thereby, the print circuit board is pressed to the holder, and sandwiched between the holder and the apexes of the screws.

The screws which press the print circuit board to the holder are screwed into the screw holes formed in the cover from the outside of the cover. However, in a system to hold a print circuit board with screws, it is necessary to operate a screw using a tool such as a screwdriver, and thereby great care is required for the operation.

Along with that, cutting scrap may be generated at the time of screwing a screw into a screw hole, and foreign substance such as the relevant cutting scrap or dust attached to the screw hole might be fed inside the cover accompanied with the screwing operation. For this reason, the foreign substance might possibly attach to the print circuit board, and if conductive foreign substance attaches to the print circuit board, that the print circuit board is short circuited is caused.

DETAILED DESCRIPTION

In general, according to one embodiment, there is provided a component supporting device including: a cover having a through-hole; a support covered with the cover; a component arranged between the cover and the support; and a fixing tool which is inserted into the through-hole of the cover from an outside of the cover and sandwiches the component between the support and the fixing tool; the fixing tool including: an elastically deformable main body having an apical surface to butt to the component; a hook provided on the main body to engage with an edge of the through-hole inside the cover; and an operating portion provided on the main body to protrude from the through-hole outside the cover which is configured to release the engagement of the hook with the edge of the through-hole through elastic deformation of the main body.

Hereinafter, embodiments will be described with reference to the drawings.

Figure 1:
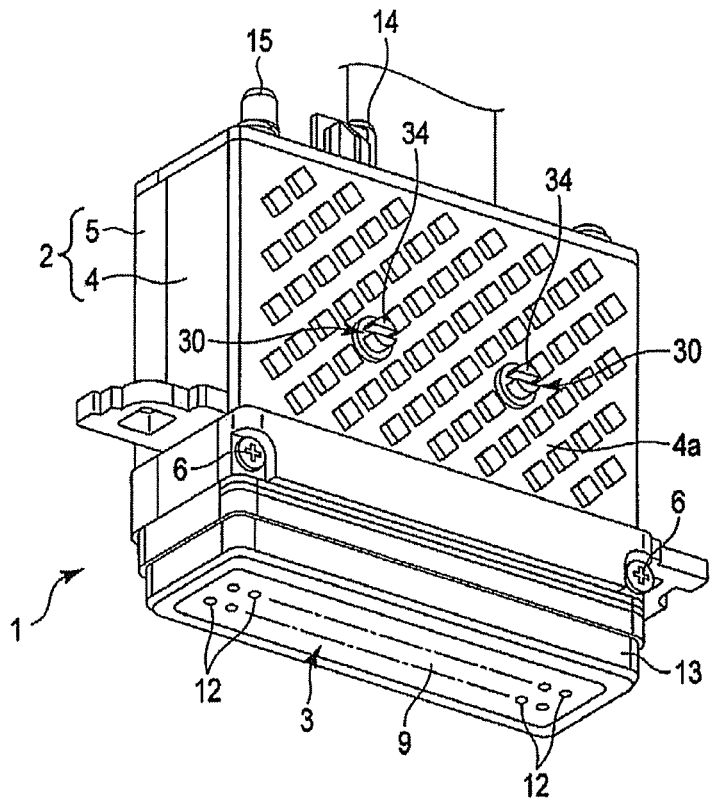
FIG. 1 is a perspective view of an ink-jet device.
Figure 2:
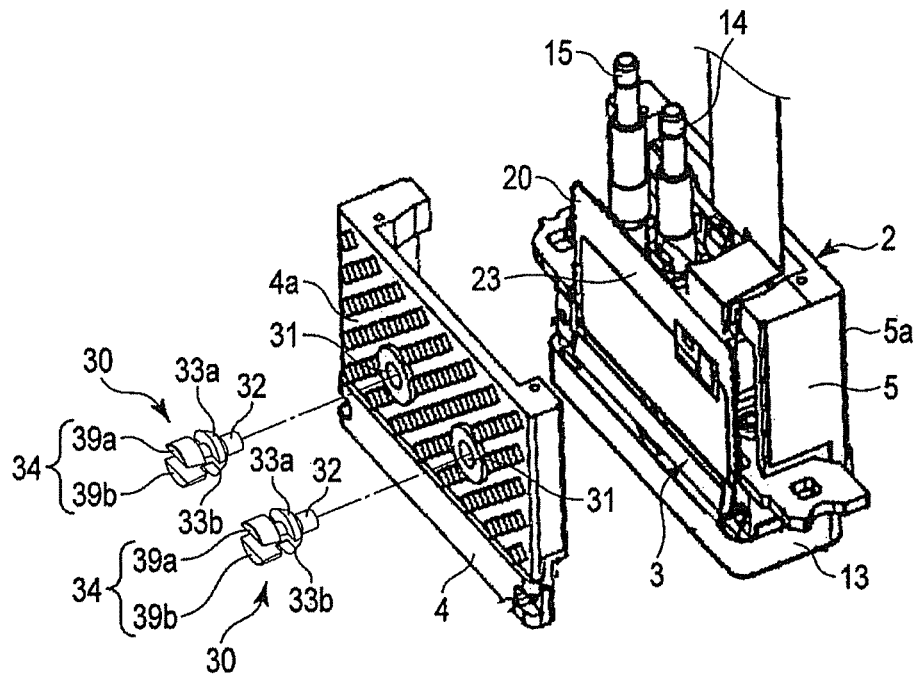
FIG. 2 is a perspective view showing the exploded ink-jet device.

FIG. 1 and FIG. 2 disclose an ink-jet device 1 which is used while being mounted on a carriage of a printer, for example. The ink-jet device 1 is provided with a cover 2 and an ink-jet head 3.

The cover 2 is composed of metal material having conductive properties, for example. The cover 2 is divided into a first cover element 4 and a second cover element 5. The first cover element 4 and the second cover element 5 have square panel portions 4a, 5a, respectively. The first cover element 4 and the second cover element 5 are fitted together such that the panel portions 4a, 5a face to each other at an interval, and integrally connected through a plurality of screws 6. For the reason, the cover 2 is formed into a square box shape which opens upward and downward.

Figure 3:
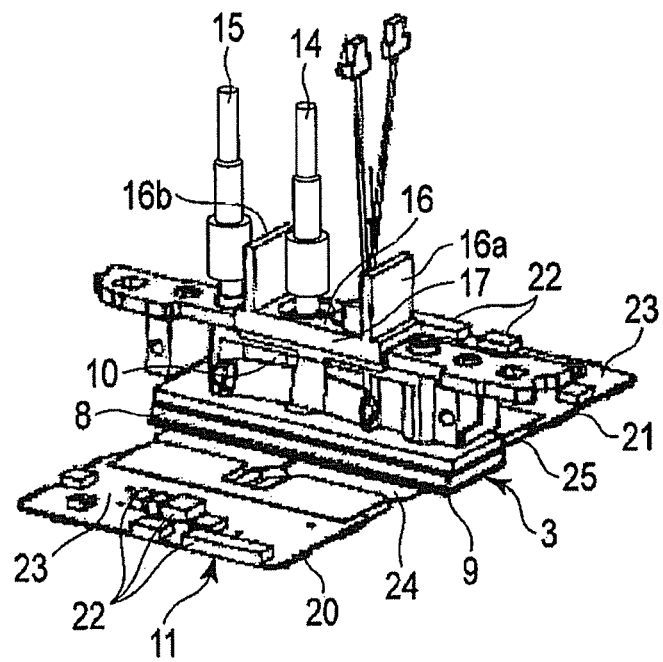
FIG. 3 is a perspective view of the ink-jet head.

As shown in FIG. 3, the ink-jet head 3 is housed inside the cover 2. The ink-jet head 3 is provided with a head body 8, a nozzle plate 9, a manifold 10, and a circuit module 11.

The head body 8 has an ink chamber to which ink is supplied and is of an elongated plate shape, and extends in the longitudinal direction of the cover 2. The ink chamber of the head body 8 houses an actuator to pressurize the ink. The nozzle plate 9 is bonded to the lower surface of the head body 8. The nozzle plate 9 has a plurality of nozzles 12 to discharge ink. The head body 8 and the nozzle plate 9 are enclosed by a mask 13. The mask 13 is linked to the lower end of the cover 2, and protrudes from the lower end of the cover 2.

The manifold 10 is an element to supply ink to the ink chamber of the head body 8, and attached to the upper surface of the head body 8. The manifold 10 is provided with an ink supply tube 14 and an ink return tube 15. The ink supply tube 14 and the ink return tube 15 are led upward the head body 8 through the inside of the cover 2.

As shown in FIG. 3, a holder 16 is attached to the manifold 10. The holder is an example of a support, and composed of insulating material such as synthetic resin. The holder 16 is located on the manifold 10, and interposed between the panel portion 4a of the first cover element 4 and the panel portion 5a of the second cover element 5.

The holder 16 has a pair of uprising portions 16a, 16b. The uprising portions 16a, 16b stand up upwardly from the manifold 10, and are lined up in the longitudinal direction of the head body 8 at an interval. In addition, a flat supporting surface 17 is formed at the side portion of the holder 16 including the uprising portions 16a, 16b. The supporting surface 17 is arranged in parallel with the panel portion 4a of the first cover element 4 and the panel portion 5a of the second cover element 5.

The circuit module 11 is an element so as to control the driving of the actuator housed in the head body 8. As shown in FIG. 3, the circuit module 11 has a first print circuit board 20 and a second print circuit board 21. Each of the first print circuit board 20 and the second print circuit board 21 is an example of a circuit component, and has a rigid substrate 23 on which a plurality of circuit elements 22 are mounted.

The first print circuit board 20 is electrically connected to the head body 8 of the ink-jet head 3 through a first flexible circuit board 24. The second print circuit board 21 is electrically connected to the head body 8 of the ink-jet head 3 through a second flexible circuit board 25. In the present embodiment, the head body 8 of the ink-jet head 3 is located between the first print circuit board 20 and the second print circuit board 21.

The first flexible circuit board 24 is folded such that the first print circuit board 20 stands up along the holder 16. As a result, the first print circuit board 20 is interposed between the first cover element 4 and the holder 16, and thereby covered by the first cover element 4.

The second flexible circuit board 25 is folded such that the second print circuit board 21 stands up along the holder 16. As a result, the second print circuit board 21 is interposed between the second cover element 5 and the holder 16, and thereby covered by the second cover element 5.

Each of the first and second print circuit boards 20, 21 is held between the cover 2 and the holder 16 using two fixing tools 30 through the use of a snap-fit system. Since the configurations to hold the first and second print circuit boards 20, 21 are common to each other, the first print circuit board 20 will be described as a representative of them.

Figure 4:
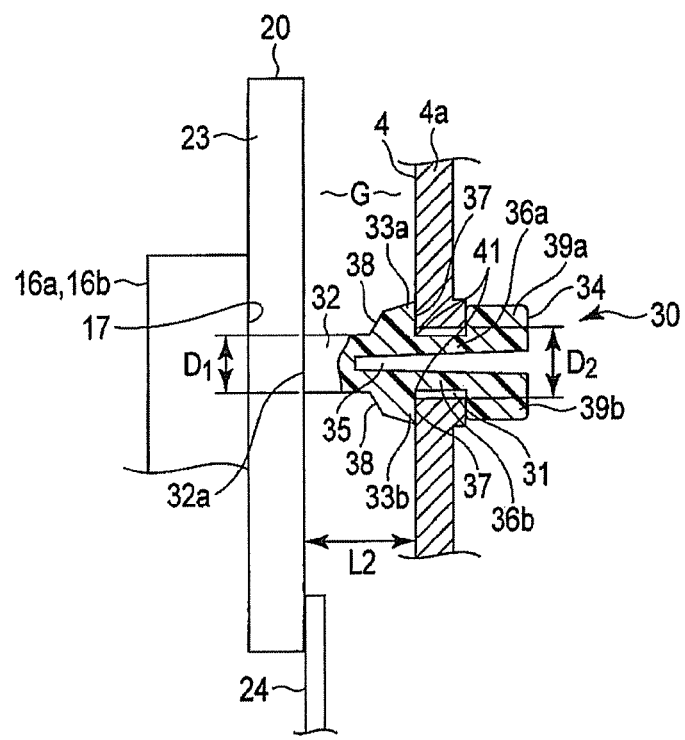
FIG. 4 is a sectional view showing a state in which the print circuit board is sandwiched between the fixing tool and the holder.

As shown in FIG. 2 and FIG. 4, the first cover element 4 to cover the first print circuit board 20 has a pair of through-holes 31. The through hole 31 is a circular hole and penetrates through the panel portion 4a of the first cover element 4 in the thickness direction. The through-holes 31 line in the longitudinal direction of the cover 2 at an interval so as to correspond to the uprising portions 16a, 16b of the holder 16, and are kept in the positional relation in which the through-holes 31 face the supporting surface 17 of the uprising portions 16a, 16b, respectively.

Figure 5:
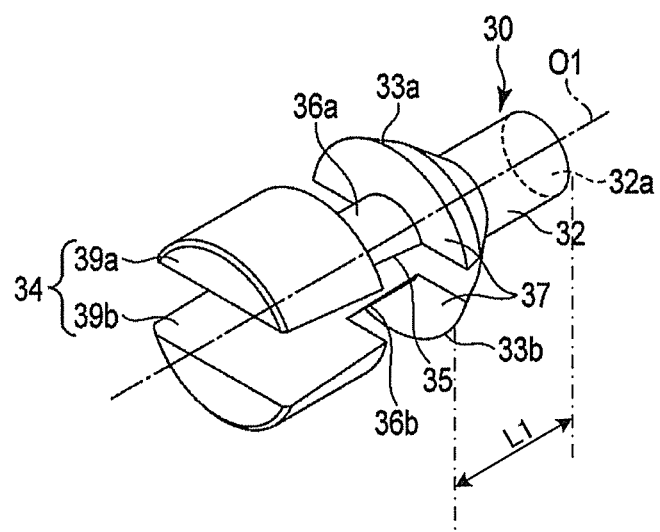
FIG. 5 is a perspective view of the fixing tool of a snap-fit system.

As shown in FIG. 2, FIG. 4 and FIG. 5, the fixing tools 30 are inserted into the through-holes 31 from outside the cover 2, and thereby press the first print circuit board 20 to the supporting surface 17 of the uprising portions 16a, 16b of the holder 16.

According to the present embodiment, the fixing tool 30 is composed of synthetic resin material having high elastic modulus out of resin material, for example, or a rubber-like elastic body. The fixing tool 30 is provided with a main body 32, a pair of hooks 33a, 33b, and an operating portion 34.

The main body 32 is column-shaped, and has a diameter D1 such that the main body 32 can be inserted into the through-hole 31 in a drawable manner. It is only necessary that the diameter D1 of the main body 32 is equivalent to a bore diameter D2 of the through-hole 31, and when the main body 32 is inserted into the through-hole 31, a gap may be or may not be between the outer circumferential surface of the main body 32 and the inner circumferential surface of the through-hole 31.

As shown in FIG. 5, the main body 32 has an apical surface 32a and a slit 35. The apical surface 32a is a flat surface orthogonal to an axis line O1 of the main body 32, and located at one end of the main body 32 along the axis direction.

The slit 35 is cut from the other end of the main body 32 along the axis direction toward the apical surface 32a. The slit 32 reaches from the other end of the main body 32 to an intermediate portion along the axis direction of the main body 32, and is opened into the outer circumferential surface of the main body 32.

By the presence of the slit 35, a pair of elastic deformation portions 36a, 36b are formed in the main body 32. The elastic deformation portions 36a, 36b face to each other at an interval in the radial direction of the main body 32 at the position which is distant from the apical surface 32a in the axis direction of the main body 32.

As shown in FIG. 4 and FIG. 5, the hooks 33a, 33b are integrally formed on the elastic deformation portions 36a, 36b, respectively. The hooks 33a, 33b protrude outside in a flange shape from the elastic deformation portions 36a, 36b along the radial direction of the main body 32, respectively.

Each of the hooks 33a, 33b has an engaging surface 37 to contact the inner surface of the panel portion 4a of the first cover element 4. The engaging surface 37 is a flat surface orthogonal to the axis line O1 of the main body 32, and is located at the opposite side to the apical surface 32a of the main body 32 along the axis direction of the main body 32. In addition, each of the outer circumferential portions of the hooks 33a, 33b forms an inclined surface 38 which is sloped so as to approach the outer circumferential surface of the main body 32 toward the apical surface 32a of the main body 32.

As shown in FIG. 4 and FIG. 5, the operating portion 34 is located at the opposite side to the apical surface 32a of the main body 32 along the axis direction of the main body 32. The operating portion 34 is an element which an operator to handle the fixing tool 30 grips with the fingertips, and has a pair of knobs 39a, 39b. The knobs 39a, 39b are integrally formed at apexes of the elastic deformation portions 36a, 36b, respectively. The knobs 39a, 39b face to each other at an interval in the radial direction of the main body 32, and protrude outside from the elastic deformation portions 36a, 36b along the radial direction of the main body 32, respectively.

Next, a procedure to hold the first print circuit board 20 between the first cover element 4 of the cover 2 and the holder 16 using the fixing tool 30 will be described.

Figure 6A:
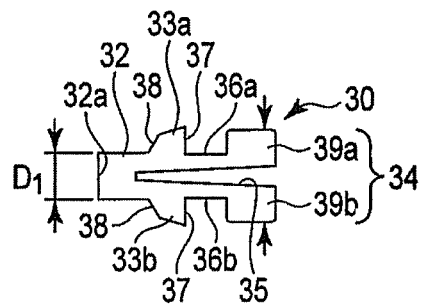
FIG. 6A is a side view of the fixing tool.
Figure 6B:
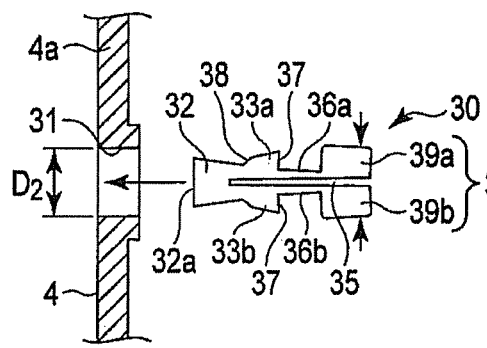
FIG. 6B is a sectional view showing a state immediately before the fixing tool is inserted into the through-hole of the first cover element while the fixing tool is elastically deformed.
Figure 6C:
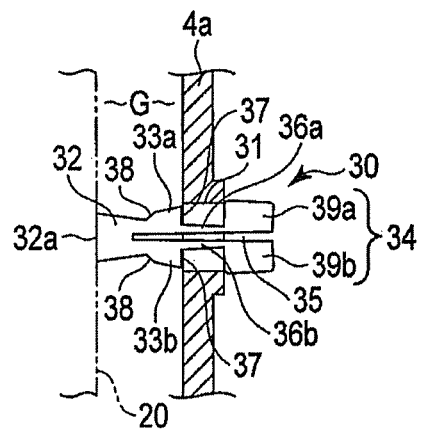
FIG. 6C is a sectional view showing a state in which the fixing tool is inserted into the through-hole of the first cover element.

To begin with, the knobs 39a, 39b of the fixing tool 30 are clipped with fingertips, and thereby the knobs 39a, 39b are pressurized in the direction in which they approach to each other as shown in arrows in FIG. 6A. Thereby, the elastic deformation portions 36a, 36b of the main body 32 elastically deform so as to reduce the width of the slit 35. Following the deformation of the elastic deformation portions 36a, 36b, the hooks 33a, 33b are displaced inside along the radial direction of the main body 32. Thereby, as shown in FIG. 6B, the hooks 33a, 33b deform in the direction to reduce the radius thereof so that the apex edges of the hooks 33a, 33b can pass through the through-hole 31 of the first cover element 4.

In this state, the fixing tool 30 is inserted into the through-hole 31 of the first cover element 4 from the outside of the cover 2. As shown in FIG. 6B, the fixing tool 30 is inserted into the through-hole 31 with the apical surface 32a of the main body 32 in the lead. Through this insertion, the hooks 33a, 33b which have been deformed so as to reduce the radius pass through the through-hole 31, and enter into a gap G between the panel portion 4a of the first cover element 4 and the rigid substrate 23 of the first print circuit board 20.

Figure 6D:
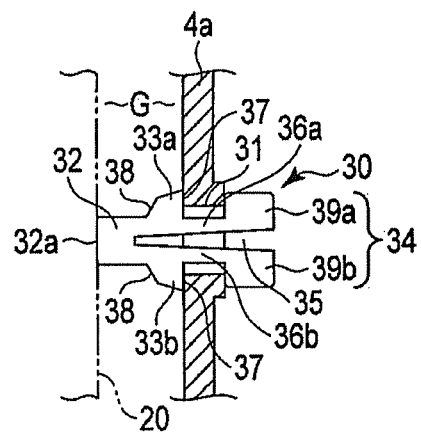
FIG. 6D is a sectional view showing a state in which the hook of the fixing tool is elastically caught on the edge of the through-hole of the cover.

Then, when the application of pressure to the knobs 39a, 39b of the fixing tool 30 is released, as shown in FIG. 6D, the hooks 33a, 33b return in the direction to broaden the radius thereof by the inherent elasticity provided in the fixing tool 30.

As a result, the engaging surfaces 37 of the hooks 33a, 33b make contact with the inner surface of the panel portion 4a, and corner portions 41 defined by the relevant engaging surfaces 37 and the outer circumferential surfaces of the elastic deformation portions 36a, 36b are caught by the edge of the through-hole 31 in a snap manner. Along with this, the apical surface 32a of the main body 32 butts the rigid substrate 23 of the first print circuit board 20, and thereby elastically pressurizes the rigid substrate 23 toward the supporting surface 17 of the holder 16.

In other words, the main body 32 of the fixing tool 30 is filled between the panel portion 4a and the rigid substrate 23 without the gap G. Thereby, as shown in FIG. 4, the rigid substrate 23 of the first print circuit board 20 is elastically sandwiched between the supporting surface 17 of the holder 16 and the apical surface 32a of the fixing tool 30, and thereby the first print circuit board 20 is held at the fixed position inside the cover 2.

In addition, in the state in which the first print circuit board 20 is held inside the cover 2, the knobs 39a, 39b of the fixing tool 30 protrude from the through-hole 31 outside the first cover element 4, and block the open end of the through-hole 31. Along with this, as shown in FIG. 4, the terminal of the slit 35 of the fixing tool 30 enters inside the cover 2, and the slit 35 becomes in the state in which the slit 35 opens into the gap G between the panel portion 4a and the rigid substrate 23.

Figure 7A:
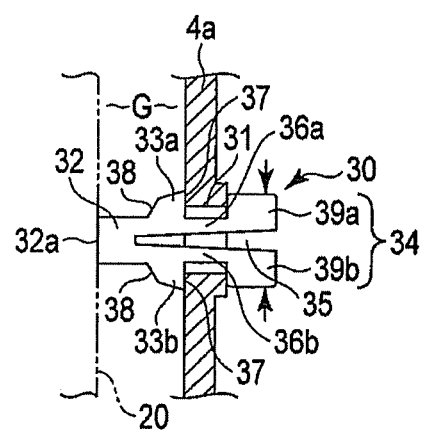
FIG. 7A is a sectional view showing a state in which the knobs are pressurized in the direction in which the knobs approach to each other, in the state in which the fixing tool is inserted into the through-hole of the first cover element.

On the other hand, in order to release the holding of the first print circuit board 20 to the cover 2, the knobs 39a, 39b of the fixing tool 30 protruding outside the first cover element 4 are clipped with fingertips, and thereby the knobs 39a, 39b are pressurized in the direction in which they approach to each other, as shown in arrows in FIG. 7A. Thereby, the elastic deformation portions 36a, 36b of the main body 32 elastically deform so as to reduce the width of the slit 35.

Figure 7B:
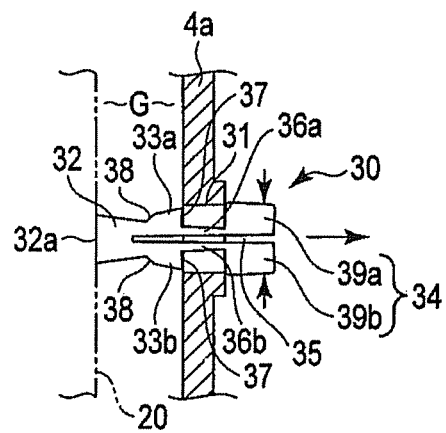
FIG. 7B is a sectional view showing a state in which the fixing tool inserted into the through-hole of the first cover element is elastically deformed and thereby the hooks of the fixing tool are broken away from the edge of the through-hole.

In addition, following the deformation of the elastic deformation portions 36a, 36b, the hooks 33a, 33b are displaced inside along the radial direction of the main body 32, and as shown in FIG. 7B, the hooks 33a, 33b deform in the direction to reduce the radius thereof so that the apex edges of the hooks 33a, 33b can pass through the through-hole 31 of the first cover element 4. Thereby, the engaging surfaces 37 of the hooks 33a, 33b break away from the inner surface of the panel portion 4a, and the corner portions 41 break away from the edge of the through-hole 31.

Accordingly, the engagement of the hooks 33a, 33b with the first cover element 4 is artificially released by a manual labor of an operator, and the fixing tool 30 becomes in the state in which the fixing tool 30 can be drawn out from the through-hole 31 of the first cover element 4.

Accordingly, as shown in arrows in FIG. 7B, the knobs 39a, 39b of the fixing tool 30 are pulled with the fingertips, and thereby the fixing tool 30 can be detached from the through-hole 31. Thereby, the apical surface 32a of the fixing tool 30 breaks away from the rigid substrate 23, and the holding of the first print circuit board 20 by the fixing tool 30 can be released.

For the matters described above, it becomes necessary that a distance L1 from the apical surface 32a to the engaging surfaces 37 of the fixing tool 30 when the fixing tool 30 is detached from the through-hole 31 is made larger than a distance L2 from the rigid substrate 23 to the panel portion 4a of the first cover element 4 when the rigid substrate 23 of the first print circuit board 20 is pressed to the holder 16, if the deformation amount of the fixing tool 30 is taken into consideration.

According to the embodiment, the fixing tool 30 is only inserted into the through-hole 31 of the first cover element 4 from the outside of the cover 2, and thereby the first print circuit board 20 can be held while it is elastically sandwiched between the apical surface 32a of the fixing tool 30 and the supporting surface 17 of the holder 16. In addition, the knobs 39a, 39b of the fixing tool 30 protruding outside the through-hole 31 are clipped and pulled with fingertips, and thereby the fixing tool 30 can be drawn out from the through-hole 31.

Accordingly, an operation to hold the first print circuit board 20 inside the cover 2 and an operation to release the holding of the first print circuit board 20 can be easily carried out without using a tool such as a screwdriver.

In addition, it is only necessary to insert the fixing tool 30 into the through-hole 31, and a screwing operation is not required at all. For this reason, when the first print circuit board 20 is held using the fixing tool 30, minute cutting scrap is hardly generated, and thereby foreign substances such as the cutting scrap and dust can be prevented from being sent between the panel portion 4a of the first cover element 4 and the first print circuit board 20.

As a result, foreign substances hardly attach to the first print circuit board 20, and short circuit of the first print circuit board 20 triggered by the attachment of conductive foreign substances can be prevented from occurring.

In addition, since the fixing tool 30 is an elastic shaped product, even if vibration is applied to the cover 2 from outside, the vibration which tries to transmit from the cover 2 to the first print circuit board 20 can be absorbed by the fixing tool 30. Accordingly, the resistance to shock of the first print circuit board 20 can be improved.

According to the present embodiment, in the state in which the fixing tool 30 is inserted into the through-hole 31 of the cover 2, the slit 35 of the fixing tool 30 opens into the gap G between the panel portion 4a and the rigid substrate 23. For the reason, the slit 35 can be utilized as a breather path and heat which the circuit element 22 generates, for example, can be discharged from the slit 35 to the outside of the cover 2.

Furthermore, the fixing tool 30 is formed with resin material having heat conductivity, for example, and thereby the fixing tool 30 can be thermally connected to both the first print circuit board 20 and the cover 2. As a result, even if heat accompanied with the operation of the circuit elements 22 is transmitted to the rigid substrate 23, the heat of the rigid substrate 23 can be discharged to the cover 2 using the fixing tool 30.

Or, the fixing tool 30 is formed with resin material having heat insulating properties, for example, the heat outside the ink-jet head device 1 which tries to transmit from the cover 2 to the first print circuit board 20 can be blocked by the fixing tool 30.

A component which is held with a fixing tool using a snap-fit system is not limited to a print circuit board, but may be a circuit component such as a socket or an element except a circuit component such as a frame.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A component supporting device comprising:
    a cover having a through-hole;
    a support covered with the cover;
    a component arranged between the cover and the support; and
    a fixing tool which is inserted into the through-hole of the cover from an outside of the cover and sandwiches the component between the support and the fixing tool;
    the fixing tool including:
        an elastically deformable main body having an apical surface to butt to the component;
        a hook provided on the main body to engage with an edge of the through-hole inside the cover; and
        an operating portion provided on the main body to protrude from the through-hole outside the cover which is configured to release the engagement of the hook with the edge of the through-hole through elastic deformation of the main body.

2. The device of claim 1, wherein when the hook is engaged with the edge of the through-hole, the apical surface of the main body butts to the component, and the component is sandwiched between the apical surface of the main body and the support.

3. The device of claim 1, wherein, in the state in which the hook of the fixing tool is engaged with the edge of the through-hole, the component is pressed to the support through the apical surface of the fixing tool.

4. The device of claim 1, wherein the fixing tool is composed of synthetic resin material having insulation properties or a rubber-like elastic body.

5. The device of claim 1, wherein the fixing tool is composed of material having heat conductivity.

6. The device of claim 1, wherein the fixing tool is composed of material having heat insulating properties.

7. The device of claim 1, wherein the main body of the fixing tool has a plurality of elastic deformation portions separated by a slit, and the hook and the operating portion are provided on the elastic deformation portion.

8. An ink-jet device comprising:
    a cover having a through-hole;
    a holder covered with the cover;
    a circuit component arranged between the cover and the holder which controls an ink-jet head to discharge ink; and
    a fixing tool which is inserted into the through-hole of the cover from an outside of the cover and sandwiches the circuit component between the holder and the fixing tool;
    the fixing tool including:
        an elastically deformable main body having an apical surface to butt to the circuit component;
        a hook provided on the main body to engage with an edge of the through-hole inside the cover; and
        an operating portion provided on the main body to protrude from the through-hole outside the cover which is configured to release the engagement of the hook with the edge of the through-hole through elastic deformation of the main body.

9. The device of claim 8, wherein when the hook is engaged with the edge of the through-hole, the apical surface of the main body butts to the circuit component, and the circuit component is sandwiched between the apical surface of the main body and the holder.

10. The device of claim 8, wherein, in the state in which the hook of the fixing tool is engaged with the edge of the through-hole, the circuit component is pressed to the holder through the apical surface of the fixing tool.

11. The device of claim 8, wherein the fixing tool is composed of synthetic resin material having insulation properties or a rubber-like elastic body.

12. The device of claim 8, wherein the main body of the fixing tool has a plurality of elastic deformation portions separated by a slit, and the hook and the operating portion are provided on the elastic deformation portion.

13. An ink-jet device comprising:
    a cover with conductivity in which a through-hole is provided;
    a holder housed inside the cover;
    a print circuit board arranged between the cover and the holder which controls an ink-jet head to discharge ink; and
    an insulating fixing tool which is inserted into the through-hole of the cover from an outside of the cover and holds the print circuit board in cooperation with the holder;
    the fixing tool including:
        an elastically deformable main body having an apical surface to butt to the print circuit board;
        a hook provided on the main body to elastically engage with an edge of the through-hole inside the cover; and
        an operating portion provided on the main body to protrude from the through-hole outside the cover which is configured to release the engagement of the hook with the edge of the through-hole through elastic deformation of the main body.

14. The device of claim 13, wherein when the hook is engaged with the edge of the through-hole, the apical surface of the main body butts to the print circuit board, and the print circuit board is sandwiched between the apical surface of the main body and the holder.

15. The device of claim 13, wherein, in the state in which the hook of the fixing tool is engaged with the edge of the through-hole, the print circuit board is elastically pressed to the holder through the apical surface of the fixing tool.

* * * * *